United States Patent [19]

Cusano et al.

[11] 4,129,243

[45] *Dec. 12, 1978

[54] DOUBLE SIDE COOLED, PRESSURE MOUNTED SEMICONDUCTOR PACKAGE AND PROCESS FOR THE MANUFACTURE THEREOF

[75] Inventors: Dominic A. Cusano, Schenectady; James A. Loughran, Scotia; Yen S. E. Sun, Liverpool, all of N.Y.

[73] Assignee: General Electric Company, Auburn, N.Y.

[*] Notice: The portion of the term of this patent subsequent to Nov. 30, 1993, has been disclaimed.

[21] Appl. No.: 696,899

[22] Filed: Jun. 17, 1976

Related U.S. Application Data

[63] Continuation-in-part of Ser. No. 600,300, Jul. 30, 1975, Pat. No. 3,994,430.

[51] Int. Cl.² .................................... H01L 23/02
[52] U.S. Cl. ............................. 228/122; 228/188; 228/198; 228/219
[58] Field of Search ............. 228/121, 122, 123, 124, 228/188, 194, 195, 198, 219, 118

[56] References Cited

U.S. PATENT DOCUMENTS

| | | | |
|---|---|---|---|
| 3,224,088 | 12/1965 | McNelly | 228/118 X |
| 3,550,254 | 12/1970 | Greenspan et al. | 228/118 |
| 3,736,650 | 6/1973 | Anderson | 228/122 |
| 3,751,800 | 8/1973 | Daniels et al. | 228/115 X |
| 3,766,634 | 10/1973 | Babcock et al. | 228/188 |
| 3,981,429 | 9/1976 | Parker | 228/194 |
| 3,994,430 | 11/1976 | Cusano et al. | 228/122 |

FOREIGN PATENT DOCUMENTS

| | | | |
|---|---|---|---|
| 545179 | 8/1957 | Canada | 228/124 |

*Primary Examiner*—Donald G. Kelly
*Assistant Examiner*—K. J. Ramsey
*Attorney, Agent, or Firm*—R. J. Mooney; S. B. Salai

[57] ABSTRACT

Disclosed is a double side cooled, pressure mounted semiconductor package and a method for the manufacture thereof. The package is formed by directly bonding upper and lower metal contact assemblies to an annular ceramic housing. Assembly is simplified if at least one contact assembly comprises two parts applied sequentially. An annular flange having a central opening approximately the size of the central opening in the annular housing and having an outside diameter larger than the outside diameter of the ceramic housing is direct bonded to one end of the housing simultaneously with a lower semiconductor contact. After a conventional semiconductor pellet is positioned in the housing, the second part, a metal contact disc with an outside diameter approximately equaling the outside diameter of the flange, is positioned thereover. Finally, the flange and the disc are welded around their peripheries.

18 Claims, 12 Drawing Figures

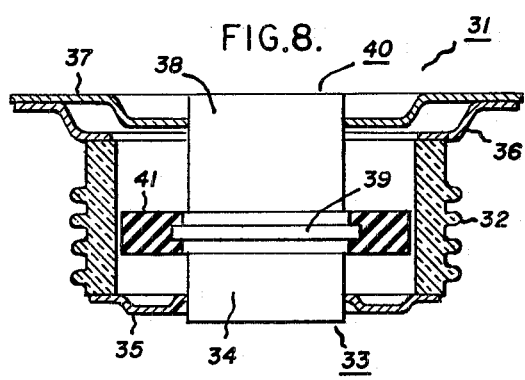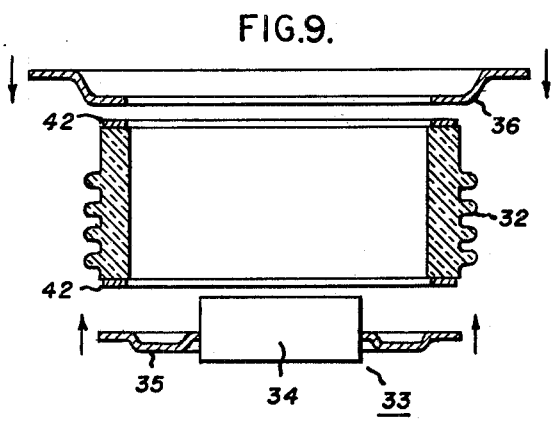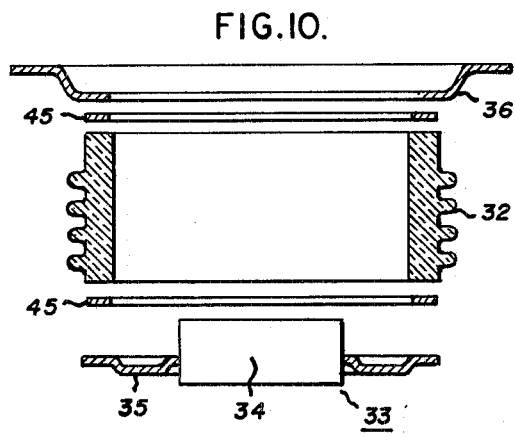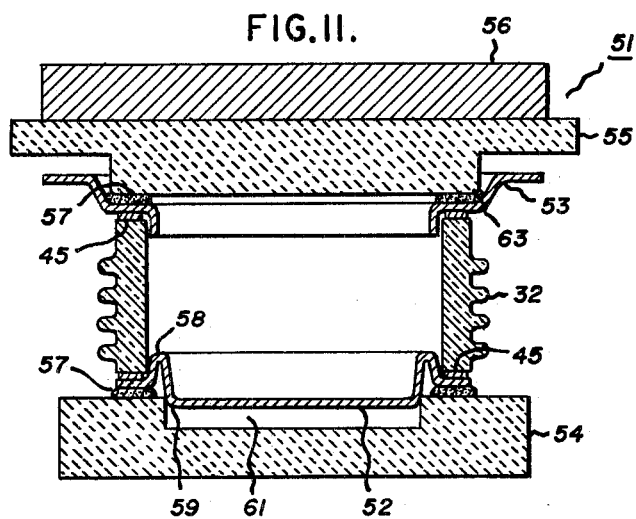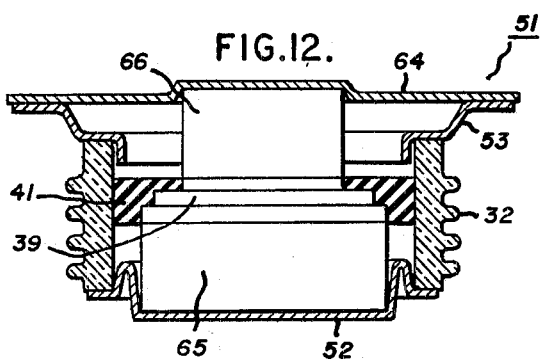

DOUBLE SIDE COOLED, PRESSURE MOUNTED SEMICONDUCTOR PACKAGE AND PROCESS FOR THE MANUFACTURE THEREOF

BACKGROUND OF THE INVENTION

This application is a continuation-in-part of our co-pending U.S. application Ser. No. 600,300, filed July 30, 1975, now U.S. Pat. No. 3,994,430 and entitled, "Direct Bonding of Metals to Ceramics and Metals."

This invention relates to a semiconductor package, and, more specifically, to a pressure mounted, double side cooled semiconductor package for power semiconductors.

Double side cooled, pressure mounted semiconductor packages, such as exemplified by U.S. Pat. No. 3,599,057, issued to William F. Lootens, are widely used in the power semiconductor field. Such packages have several features which make them very attractive to the semiconductor device designer. For example, they are rugged, provide hermetic protection for the semiconductor pellet and are able to effectively transfer substantial amounts of heat to a heat sink.

However, the package is not inexpensive to manufacture. One economic problem stems from the bond which must be formed between the metal contact assemblies and the ceramic housing. That bond must be sufficiently rugged to withstand any potential abuse and, furthermore, must assure hermeticity. A less expensive manner of forming the bond would be of interest to semiconductor device designers.

It is, therefore, an object of this invention to provide an improved double side cooled, pressure mounted semiconductor package with a more economical metal to ceramic seal, yet a package which meets the aforementioned requirements. It is also an object of this invention to provide a method for manufacturing the subject package.

SUMMARY OF THE INVENTION

This invention is characterized by a double side cooled, pressure mounted semiconductor package and a method for the fabrication thereof. An annular ceramic housing has upper and lower metal contact assemblies peripherally coupled to its upper and lower ends to form the semiconductor package. The coupling is formed by a direct bond between the metal and the ceramic in the presence of a bonding agent, as will be described more fully below. A conventional semiconductor pellet assembly is retained within the package. The direct bond technique has been found less expensive and more reliable than other ceramic metallizing techniques.

The preferred method of manufacturing the package begins by directly bonding a metal lower contact disc and a metal upper contact flange to the respective ends of the ceramic housing. A conventional semiconductor pellet assembly is positioned within the housing and an upper metal contact disc is placed over the upper contact flange and welded thereto around the periphery. Thus, a rugged and completely hermetic semiconductor package is provided.

It has been found that utilizing alumina as a ceramic, copper as the metal, and oxygen as the bonding agent, provides excellent adhesion and hermeticity characteristics.

If more massive contacts are desired, inwardly facing recesses can be provided in each of the contact discs and massive metal contact plates can be positioned in the recesses.

It has been found that stacking the assembly and applying weight to it during the bonding process provides a better bond. This can easily be done by placing the stacked assemblies between bodies of refractory material, such as firebrick, and placing a weight on the upper firebrick. Tungsten forms an excellent weight due to its high weight to thermal mass ratio.

It has also been found that assembly can be substantially simplified by forming shoulders on the lower contact disc and on the contact flange which register with openings in the refractory material and also register with the annular ceramic housing. In this manner proper alignment and concentricity is assured during the entire bonding process without the need for external clamping fixtures.

As will be discussed below, there are many ways to introduce the bonding agent to the system during bonding. These ways are taken from U.S. Pat. No. 3,766,634, Babcock, et al., and from our aforementioned copending application.

DESCRIPTION OF THE DRAWINGS

These and other features and objects of the present invention will become more apparent upon a perusal of the following description and taken in conjunction with the accompanying drawings wherein:

FIG. 8 is a sectional elevation view of a preferred semiconductor package;

FIG. 9 is an exploded view illustrating an initial assembly step in the formation of the package shown in FIG. 8;

FIG. 10 is a diagrammatic exploded view illustrating an assembly step corresponding to that shown in FIG. 9, but which is employed when alternate methods of introducing the bonding agent are employed;

FIG. 11 shows a stacking arrangement utilized to assure concentricity and to apply proper pressure to the stacked combination during bonding; and FIG. 12 is a sectional elevation view of another preferred pressure mounted, double side cooled semiconductor housing.

DESCRIPTION OF THE PREFERRED METHODS AND EMBODIMENTS

Figure 1:
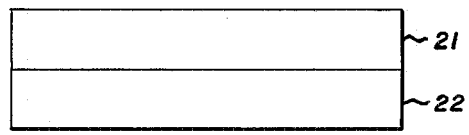
FIG. 1 is a diagrammatic, sectional elevation view of a body of ceramic and a body of metal bonded by the direct bonding process.

It is felt that a brief description of several methods of directly bonding metals to ceramics will be helpful at this time. Referring first to FIG. 1, there is shown a sectional elevation view of a metal 21 directly bonded to a ceramic substrate 22 with a eutectic interface layer 23 therebetween. The eutectic in the layer 23 is a metal and bonding agent as will be discussed below. The eutectic layer is so named for convenience. It really consists of only a small amount of eutectic composition, typically only a few percent, and the vast majority of it is the metal. Thus, the term "direct bond" will be understood since, for purposes of thermal and electrical conduction and the like, the bond behaves essentially as if it were metal and ceramic, with no eutectic present.

Figure 2:
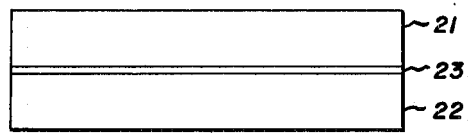
FIG. 2 is a view of the combination of FIG. 1 prior to bonding, but readied for bonding in a reactive atmosphere.

The aforementioned patent of Babcock describes a method for directly bonding metals to ceramics by means of a eutectic in a reactive atmosphere. The bonding process is carried out at an elevated temperature. Specifically, the metal 21 and the substrate 22 are placed adjacent each other as shown in FIG. 2 and are heated to an elevated temperature below the melting point of the metal in the presence of a bonding agent. The bonding agent is the one which forms the eutectic with the metal, and the heating is, of course, to a temperature in excess of the eutectic temperature. The interface between the metal and the ceramic is exposed to the bonding agent by its inclusion in the atmosphere, during heating, usually in a small amount, such as one-half of 1 percent.

A eutectic is formed during heating. The melt must wet the substrate 22 and, upon cooling and resultant solidification, it will bond tenaciously thereto. It should be appreciated that the melt, and thus layer 23, will completely cover the metal, but for reasons of clarity it is only shown at the interface. Taking as an example, a bond between copper and alumina utilizing a copper-copper oxide eutectic, bond strengths in excess of 20,000 pounds per square inch and peel strengths in excess of 70 pounds per inch have been achieved.

It should be realized that simply bringing any metal and any ceramic substrate together and forming a eutectic melt therebetween is not sufficient to insure bonding on cooling. While the nature of the bond is not fully understood, it is believed that there must be some bonding, such as covalent bonding, or a potential compound between the eutectic and the substrate in order to form a bond. Thus, while a copper oxide eutectic forms a good bond with a ceramic, a copper sulfide eutectic will not bond to ceramic. This problem has been known for some time and selection of a proper bonding agent for a given metal and substrate is within the ability of those skilled in the art. Such selection can be made on the basis of known working combinations such as disclosed by Babcock and our aforementioned application, or new combinations can be ascertained by simple trial and error processes.

The bonding method disclosed in our aforementioned application involves utilizing a solid state source of the bonding agent which is in direct contact with the metal. FIGS. 3-7 illustrate several different methods of associating the solid state source with the bonding system. The following explanation of the several FIGS. 3-7 will use the example of a copper-copper oxide bonding system. However, it should be understood that these methods are not restricted to copper-copper oxide.

Figure 3:
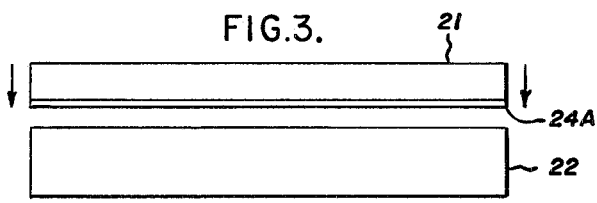
FIG. 3 is a diagram illustrating the direct bonding of metal to a ceramic wherein the metal previously has been reacted with the bonding agent.

Referring first to FIG. 3, there is shown a sheet of copper 21 bearing thereon a layer of copper oxide 24A on the side adjacent the ceramic substrate 22. It is the oxide layer which serves as an oxygen source. The copper 21 is positioned on the substrate by moving the copper in the direction shown by the arrows. When the copper is positioned on the substrate, the copper oxide 24A is sandwiched between the copper and the substrate. Thus, the copper oxide 24A is exposed to the interface between the copper 21 and the substrate 22.

After the copper 21 is positioned on the substrate 22, the combination is heated in an inert atmosphere to a temperature above the eutectic temperature of the copper-copper oxide eutectic but below the melting point of the copper for a sufficient period of time to form a melt at the interface. The temperature is preferably in the range of 1072° C. The heating step is most easily performed in a tunnel oven supplied with a nitrogen atmosphere. In order to prevent excessive dissociation, the temperature rise should be fairly rapid; for example, room temperature to eutectic temperature in three or four minutes or less. A few seconds above the eutectic temperature is adequate to form a bond with thin (1 to 10 mil) copper. Time increases beyond several minutes appear to offer no advantage even for thicker copper. Such times, temperatures, and oxide thicknesses provide a final melt that is hypoeutectic. Upon cooling, the melt solidifies and the bond is formed.

It should be understood that the upper surface of the copper 21 could, in addition to the lower surface, be oxidized if it is more convenient to simply oxidize both surfaces. Oxide on the upper surface will not interfere with the bonding at the copper and substrate interface.

The oxide can be grown in any convenient manner. For example, it may be thermally grown, formed by anodizing, or chemically formed by "Ebonol C" or any other oxidizing agent. "Ebonol C" is available from Enthone, Inc., New Haven, Conn. Yet another alternative is to deposit particulate copper oxide in a layer 24A on the copper. Preferably, the particulate copper oxide is mixed with an appropriate vehicle to make handling easier. Deposition can be by painting, silk screening, or any other appropriate technique. The vehicle is preferably an organic compound that vaporizes during the heating step and thus is not present in the final bond. If it is felt that such a deposition of particulate copper oxide would yield a layer 24A with too high of an oxide content and thus create the danger that all the copper may melt, the particulate copper oxide may be mixed with particulate copper to reduce the percentage of oxygen in the deposition.

An excellent method of bonding 10 mil copper to ceramics is as follows: 1,000 Angstroms of cupric oxide is chemically grown, with "Ebonol C," on each side of the copper. The oxidized copper is placed on the substrate and the combination is passed through a tunnel oven and heated, in nitrogen, to about 1072° C. in 3 to 3½ minutes and held there for 4 minutes. Upon cooling, the bond is formed.

At equilibrium at 1065° C., 1,000 Angstroms of cuprous oxide forms a melt about 21,500 Angstroms thick. At 1075° C., the melt is about 40,000 Angstroms thick. Ten mils equals 2,500,000 Angstroms. The melts in the aforementioned process are each less than 40,000 Angstroms thick so that over 2,400,000 Angstroms, or well over 9 mils, of copper remains substantially solid to provide dimensional stability.

Figure 4:
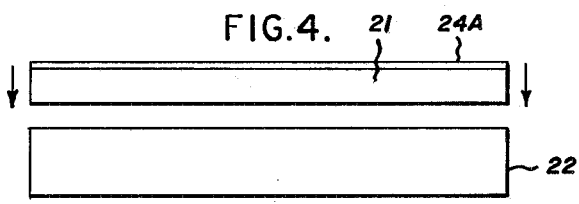
FIG. 4 illustrates another technique of bonding a prereacted metal to a ceramic. In this instance, one side of the metal has been prereacted with the bonding agent and that side faces away from the ceramic during bonding.

Referring now to FIG. 4, there is shown a bonding system similar to that shown in FIG. 3, except that the oxide layer 24A is on the upper surface of the copper 21. The oxide layer 24A can be chemically, anodically, or thermally formed on the copper as was described above, or can be deposited in a particulate form as was also described above. When the copper layer 21 is moved in the direction of the arrows to be positioned on the substrate 22, the copper comes in direct contact with the substrate and forms the bonding interface therewith.

In the configuration depicted in FIG. 4, the bulk of the melt is on the upper surface at the oxide layer 24A during heating. However, as the temperature is increased during the heating step, a certain amount of oxide diffuses through the copper by what is believed to be solid state diffusion and reaches the lower surface. Furthermore, it is possible that some capillary paths of the liquid melt pass through the copper when the temperature exceeds the eutectic temperature, thus permitting a small amount of the melt to directly reach the lower surface of the copper 21. Inasmuch as the copper 21 and the substrate 22 are abutted at the interface, only a small amount of melt is necessary to substantially fill the interface. Consequently, upon cooling, a bond is formed. When oxidizing the upper surface, the oxide layer is preferably somewhat thicker than the oxide used in the configuration of FIG. 3, but the times are about the same.

Figure 5:
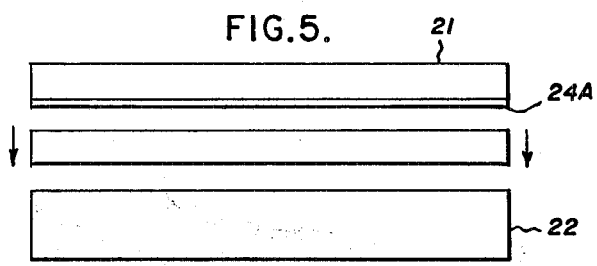
FIG. 5 illustrates the bonding of a laminate of two metals, one of which has been prereacted with the bonding agent, to a ceramic.

Referring next to FIG. 5, there is shown yet another variation of the present method. Two copper sheets 21 are used and a layer of copper oxide 24A is placed on at least one of them so that the oxide is between the sheets. It does not matter which sheet the oxide is on because when the sheets are moved in the direction of the arrows, each sheet comes into contact with the thin oxide layer. The oxide layer 24A can, of course, be deposited by any of the aforementioned techniques.

During bonding, the melt initially forms between the copper sheets. Ultimately, a quantity of the melt reaches the interface between the lower copper sheet and the substrate 22 as was described with respect to FIG. 4. The major portion of the melt remains at the interface between the two metals. Upon cooling, the metals are bonded to each other by the melt therebetween and the lower metal sheet 21 is bonded to the substrate 22 by the melt therebetween.

Figure 6:
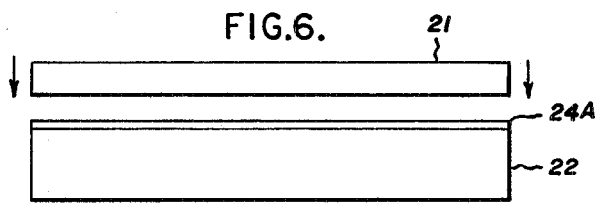
FIG. 6 is a diagrammatic view illustrating the bonding of a metal to a ceramic which has had predeposited thereon a compound of the metal and the bonding agent.

Yet another variation of the method is depicted in FIG. 6. An oxide layer 24A is deposited on the substrate 22 by any conventional technique such as those disclosed above, or by any other conventional technique such as oxidizing a layer of sputtered, evaporated or electroless plated copper. Then, when the metal 21 is moved in the direction of the arrows and comes to rest on the oxide layer 24, behavior is similar to that described with respect to FIG. 3, and bonding occurs upon heating and subsequent cooling.

In each of the above variations, the amount of oxygen available is easily controlled by controlling the amount of oxide solid state source present.

Figure 7:
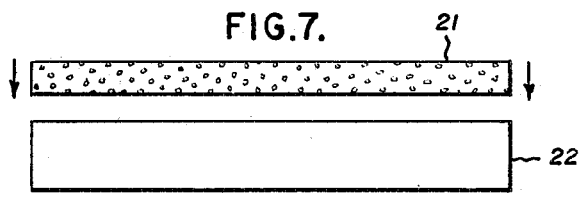
FIG. 7 is a diagrammatic view illustrating the bonding of a metal to a ceramic wherein the metal contains distributed therethrough a sufficient amount of the bonding agent to form the bond.

Referring now to FIG. 7, there is shown yet another variation of the present invention. The metal layer 21 in FIG. 7 is electrolytic tough pitch copper, a commonly available form of copper that contains an amount of oxygen sufficient to perform direct bonding. Typically, tough pitch copper contains approximately 100 to 2,000 parts per million of oxygen in the forms of dissolved oxygen and copper oxide. It has been found that the oxygen contained in tough pitch copper is sufficient to provide bonding in a few seconds above 1065° C. Thus, when using tough pitch copper, the solid state source of the bonding agent is the copper itself.

Referring next to FIG. 8, there is shown a double side cooled, pressure mounted semiconductor package 31 including an annular ceramic housing 32 with a lower contact assembly 33 affixed to the lower portion thereof. The contact assembly consists of a massive metallic electrode 34 and a flexible disc 35 that is bonded at its periphery to the ceramic housing 32. Bonded to the other end of the ceramic housing 32 is an upper contact assembly 40 including a thin flange 36 which is welded around its periphery to a thin flexible contact disc 37 that supports a second massive metal contact 38. Between the two contacts is a conventional semiconductor pellet assembly 39 which is held centered by a room temperature vulcanizing rubber ring 41. The structure as thus far described is conventional and can be used to package various types of semiconductive devices such as SCRs and rectifiers. If further information on such packages is desired, reference is made to the *SCR Manual*, Copyright 1972 by the General Electric Company, Syracuse, N.Y.

The package 31 can advantageously be manufactured by the direct bonding technique as will be described below.

Referring now to FIG. 9, there is shown the ceramic housing 32 with portions of copper oxide 42 deposited on the upper and lower surfaces thereof. The oxide can be deposited by any convenient method, but is preferably deposited by silk screening particulate copper oxide and particulate copper in an organic vehicle. After the oxide layer 42 is deposited, the lower contact assembly 33 and the flange 36 are placed in their final positions and the assembly is subjected to an appropriate heating and cooling cycle to form a direct bond between the ceramic 32 and the disc 35 and flange 36. It will, of course, be realized that the copper oxide regions 42 could be formed or deposited on the disc 35 and the flange 36, rather than on the ceramic. A small weight on the assembly during heating helps assure hermeticity in the finished device.

After the disc 35 and the flange 36 are bonded to the ceramic housing 32, the pellet subassembly 39 bearing the ring 41 is put in place and then the upper contact assembly 40 is put in position and the peripheral weld is formed between the disc 37 and the flange 36 to complete device assembly.

It will be plain at this point that the deposited layers of oxide 42 can be dispensed with if the technique taught by Babcock is to be employed. In other words, if the atmosphere during the heating process contains the selected bonding agent, that in itself can supply a sufficient amount thereof to form the bond.

Another alternative which can be employed is to preoxidize the disc 35 and the flange 36. If such a preoxidation step is employed, the layers 42 deposited oxide can be dispensed with inasmuch as the oxide will provide the requisite amount of oxygen as was explained with respect to the bonding systems illustrated in FIGS. 3–5. If the preoxidation technique is chosen, it may be desired to mask the disc and flange during preoxidation to restrict preoxidation to only the portions of the disc and the flange which will form an interface with the housing 32. Or, the entirety of the disc 35 and the flange 36 can be oxidized and unwanted oxide can be chemically removed prior to bonding by a masking and etching step. (It will be appreciated that the entire surface can be left oxidized, if more convenient.)

Referring now to FIG. 10, there is shown a similar package assembly technique with like components being given like reference numerals. The oxygen is supplied in the embodiment of FIG. 10 by incorporating a preoxidized preform 45 in each interface. The preforms 45 are preferably oxidized heavily enough that they completely liquefy during the heating process, yet not so heavily that they liquefy the disc 35 and the flange 36. Final assembly of the device shown in FIG. 10 is the same as the assembly of the device shown in FIG. 9.

Regardless of the bonding technique chosen, it has been found that copper discs and flanges approximately 10 to 20 mils thick form excellent packages. When utilizing copper, such preforms, if selected, are preferably in the range of 3 to 5 mils thick and have a total oxide thickness of at least one-quarter mil. Thus, if each side of each preform is oxidized, the oxide layer need be only one-eighth mil thick for a total thickness of one-quarter mil per preform. Such an oxide thickness assures that the preform will completely liquefy. Complete liquification of the preform is desired inasmuch as that assures an ample supply of liquid during the bonding process thus promoting hermeticity.

Referring now to FIG. 11, there is shown the fabrication of another embodiment 51 of the package. The annular ceramic housing is between a lower contact disc 52 and an upper contact flange 53. For bonding, the device is illustrated as having the preform 45 in place. However, it should be understood that any of the aforementioned methods of introducing the gaseous element can be employed.

The stacked assembly is placed between a lower block of refractory material 54 and an upper block of refractory material 55. K23 firebrick works well as the blocks 54 and 55. Preferably, a weight 56 is placed on top of the assembly to provide pressure during bonding and to assure hermeticity. The weight is effective for providing hermeticity because the metal is within a few degrees of its melting point during bonding and is thus quite soft. Thus, the weight causes the metal to conform to the contour of the housing. Tungsten is an excellent weight material due to its high weight to thermal mass ratio.

It has been found that the direct bond system is an excellent method of attaching metals to almost any ceramic material. Thus, care must be taken that the disc 52 and flange 53 do not become bonded to the refractory firebrick 54 and 55. An easy way of assuring that there is no tenacious bond has been found in the deposition of coarse refractory powder 57 between the disc 52 and flange 53 and the bodies of firebrick 54 and 55. For example, aluminum oxide of a size in the range of 70 to 80 mesh works well. The coarse powder is of such an irregular shape that even though it may bond to the metal parts, it has little contact area therewith and can easily be mechanically removed following bonding.

The lower contact disc 52 has a shoulder portion 58 which mates with the interior surface of the housing 32 to assure concentricity of the housing and the disc. A second shoulder portion 59 is provided which mates with an opening 61 in the firebrick 54 to assure proper alignment therewith during the bonding process. Similarly, a shoulder portion 62 on the flange 53 mates with the interior of the housing 32 to assure concentricity, and a second shoulder portion 63 mates with a projection from the upper body of firebrick 55 to assure alignment therebetween. Thus, the assembly, when prepared for bonding as in FIG. 11, is self-aligning and no extra clamps or fixtures are needed to assure that it remains aligned.

Assembly of the embodiment 51 is completed as was the assembly of the package 31. Specifically, after a semiconductor assembly 39 has been placed in the housing, an upper metal contact disc 64 is positioned over the flange 53 and the two are welded, generally cold welded, around their common peripheries.

If massive metal contact plates are desired in the package 51, they can be added. It will be appreciated that each disc 52 and 64, as illustrated, defines a centrally located, inwardly-facing recess. These recesses receive massive contact plates 65 and 66. The plates can be soldered in the recesses if desired.

Thus, to summarize, following the heating and cooling of the assembly shown in FIG. 11 to effect a direct bond, the contact plate 65 is placed, and soldered if desired, in the recess of the disc 52. Next, the semiconductor assembly is positioned on the plate and held concentric by the RTV ring 41. Finally, the upper contact disc 64 and plate 66 are put in position and the peripheral weld is formed between the flange 53 and the disc 64. Device assembly is then complete.

It will be appreciated that no particular significance is attached to the terms upper and lower as used in the foregoing description. They were used as terms of convenience to describe what was shown in the Figures, but it will be readily appreciated that a contact assembly including a flange could be included on either or both ends of the annular ceramic housing, not necessarily just on the upper end.

In view of the foregoing, many modifications and variations of the present invention will be apparent to those skilled in the art. For example, many other metal and bonding agent combinations will readily occur, particularly if one studies the teachings of Babcock and our aforementioned patent application. Or, if the thermal tolerances of the semiconductor assembly permit it, the flange 36 can be dispensed with and similar discs 35 or 52 bonded, probably simultaneously, to the opposite ends of the housing. It is to be understood, therefore, that the invention can be practiced otherwise than as specifically described.

We claim:

1. A method of manufacturing a double side cooled pressure mounted semiconductor package comprising the steps of:

providing an annular ceramic housing;

providing a metal lower contact disc and a metal upper contact flange;

direct bonding said lower metal contact disc to the lower end of said housing and direct bonding said upper contact flange to the upper end of said housing, said direct bonding process being carried out by exposing the interface of the metal and the ceramics to a bonding agent that forms a eutectic alloy with the metal, said eutectic alloy consisting predominately of said metal and having a melting point lower than the melting point of said metal, heating the combination to a temperature between the eutectic temperature and the melting point of the metal for at least a few seconds in an inert atmosphere to form a melt at the interfaces between said metal contact disc, the metal contact flange and said ceramic housing, wherein said steps of exposing and heating are carried out such that said melt is at least ultimately hypoeutectic, and cooling the combination;

positioning a semiconductor pellet subassembly in said housing;

positioning an upper metal contact disc on said flange so as to close said package; and welding said upper contact disc and said flange around their peripheries so as to seal said package.

2. A method according to claim 1 wherein each of said discs defines a centrally located inwardly facing recess, and each of said recesses receives a massive metal contact plate, and said semiconductor pellet assembly fits between said plates.

3. A method according to claim 1 wherein said substep of exposing the interface of said metal to said ceramic comprises positioning a preform in each of said interfaces, said preforms being of the same metal as that forming the interface and being heavily prereacted with said bonding agent.

4. A method according to claim 3 wherein said preforms are sufficiently heavily prereacted that they completely liquefy and fill the interfaces during the substep of heating above the eutectic temperature.

5. A method according to claim 4 wherein said metal and said preforms are copper, said bonding agent is oxygen, and said ceramic is alumina.

6. A method according to claim 5 wherein said preforms are in the range of three to five mils in thickness and are oxidized to a total depth of at least about one-quarter mil.

7. A method according to claim 1 wherein said contact discs and said flange are in the range of ten to twenty mils in thickness.

8. A method according to claim 1 wherein, prior to heating, said combination is placed in a refractory body and thence a second refractory body is placed on said combination.

9. A method according to claim 8 wherein said lower contact disc defines a shoulder which mates with the lower end of said housing to keep said disc and said housing concentric and also defines a second shoulder which mates with a shoulder defined by said refractory body to maintain alignment therebetween, and wherein said upper contact flange defines a shoulder which mates with the upper end of said housing to keep said flange and said housing concentric and also defines a second shoulder which mates with a shoulder defined by said second refractory body to maintain alignment therebetween.

10. A method according to claim 9 wherein a weight is placed on said second refractory body.

11. A method according to claim 10 wherein said weight is tungsten.

12. A method according to claim 8 wherein a layer of relatively coarse refractory powder is disposed between said refractory bodies and said metal.

13. A method according to claim 12 wherein said coarse powder consists of aluminum oxide of a size in the range of 70 to 80 mesh.

14. A method according to claim 1 wherein said metal is electrolytic tough pitch copper and said bonding agent is the oxygen in said copper.

15. A method according to claim 1 wherein said lower contact disc and said upper contact flange are copper and said substep of exposing said interface to a bonding agent comprises preoxidizing said copper.

16. A method according to claim 15 wherein said preoxidation is carried out only on the portions of said copper that are to be in said interfaces.

17. A method according to claim 1 wherein said substep of exposing said interfaces to a bonding agent comprises disposing on one of the surfaces of each interface a particulate layer of a compound of said metal and said bonding agent.

18. A method according to claim 1 wherein said metal is copper, said bonding agent is oxygen, and said ceramic is alumina.

* * * * *